US010146619B2

(12) United States Patent
Muralimanohar et al.

(10) Patent No.: US 10,146,619 B2
(45) Date of Patent: Dec. 4, 2018

(54) ASSIGNING REDUNDANCY IN ENCODING DATA ONTO CROSSBAR MEMORY ARRAYS

(71) Applicant: Hewlett Packard Enterprise Development LP, Houston, TX (US)

(72) Inventors: Naveen Muralimanohar, Santa Clara, CA (US); Erik Ordentlich, San Jose, CA (US); Amit S. Sharma, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 8 days.

(21) Appl. No.: 15/320,852

(22) PCT Filed: Jul. 31, 2014

(86) PCT No.: PCT/US2014/049259
§ 371 (c)(1),
(2) Date: Dec. 21, 2016

(87) PCT Pub. No.: WO2016/018397
PCT Pub. Date: Feb. 4, 2016

(65) Prior Publication Data
US 2017/0199786 A1  Jul. 13, 2017

(51) Int. Cl.
*G11C 29/00* (2006.01)
*G06F 11/10* (2006.01)
(Continued)

(52) U.S. Cl.
CPC ...... *G06F 11/1076* (2013.01); *G06F 11/1048* (2013.01); *G11C 8/10* (2013.01); *G11C 29/702* (2013.01); *G11C 29/808* (2013.01); *H03M 13/13* (2013.01); *H03M 13/2921* (2013.01); *H03M 13/6566* (2013.01); *G06F 3/0619* (2013.01); *G06F 3/0631* (2013.01); *G06F 3/0679* (2013.01); *G11C 7/1006* (2013.01)

(58) Field of Classification Search
CPC .. G06F 11/1076; G06F 3/0619; G06F 3/0631; G06F 3/0679; H03M 13/6566; H03M 13/13; H03M 13/2921
See application file for complete search history.

(56) References Cited

U.S. PATENT DOCUMENTS 7,286,431 B2  10/2007  Hidaka
7,423,898 B2   9/2008  Tanizaki et al.
(Continued)

OTHER PUBLICATIONS

Ghofrani, A. et al., Towards Data Reliable Crossbar-Based Memristive Memories, International Test Conference, IEEE, Sep. 6-13, 2013, Paper 14.3, pp. 1-10.
(Continued)

*Primary Examiner* — Samir W Rizk
(74) *Attorney, Agent, or Firm* — Michael A. Dryja

(57) ABSTRACT

According to an example, a method for assigning redundancy in encoding data onto crossbar memory arrays is provided wherein each of said crossbar memory arrays include cells. The data may be allocated to a subset of the cells in multiple crossbar memory arrays. The redundancy for the data may then be assigned based on coordinates of the subset of cells within the multiple crossbar memory arrays onto which the data is allocated.

15 Claims, 9 Drawing Sheets

(51) Int. Cl.
  *G11C 8/10* (2006.01)
  *H03M 13/13* (2006.01)
  *H03M 13/29* (2006.01)
  *H03M 13/00* (2006.01)
  *G06F 3/06* (2006.01)
  *G11C 7/10* (2006.01)

(56) References Cited

U.S. PATENT DOCUMENTS

| | | |
|---|---|---|
| 7,924,639 B2 | 4/2011 | Park et al. |
| 8,139,397 B2 | 3/2012 | Chen et al. |
| 8,143,653 B2 | 3/2012 | Cho et al. |
| 2006/0028864 A1* | 2/2006 | Rinerson ............ G11C 11/16 365/158 |
| 2006/0221728 A1 | 10/2006 | Fasoli et al. |
| 2007/0140033 A1 | 6/2007 | Yang et al. |
| 2008/0089110 A1 | 4/2008 | Robinett et al. |
| 2008/0205171 A1 | 8/2008 | Bankman et al. |
| 2013/0088909 A1 | 4/2013 | Liu et al. |
| 2014/0119094 A1 | 5/2014 | Lee et al. |

OTHER PUBLICATIONS

International Searching Authority, The International Search Report and the Written Opinion, PCT/US2014/049259, dated Feb. 27, 2015, 10 Pages.

* cited by examiner

US 10,146,619 B2

ASSIGNING REDUNDANCY IN ENCODING DATA ONTO CROSSBAR MEMORY ARRAYS

BACKGROUND

Electronic data is typically represented using a binary number system. The binary number system is one in which values may take on one of two states, typically represented by a logical "1" and a "0". Various types of memory systems have been developed, which include small programmable devices that store a single bit as either a logical "1" or a "0". The ON state may be used to represent a logical "1," while the OFF state may be used to represent a logical "0". One type of memory architecture is the crossbar memory architecture. The crossbar memory architecture includes two sets of interconnecting conductor segments and memory elements are placed at multiple crosspoints between the interconnecting conductor segments.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
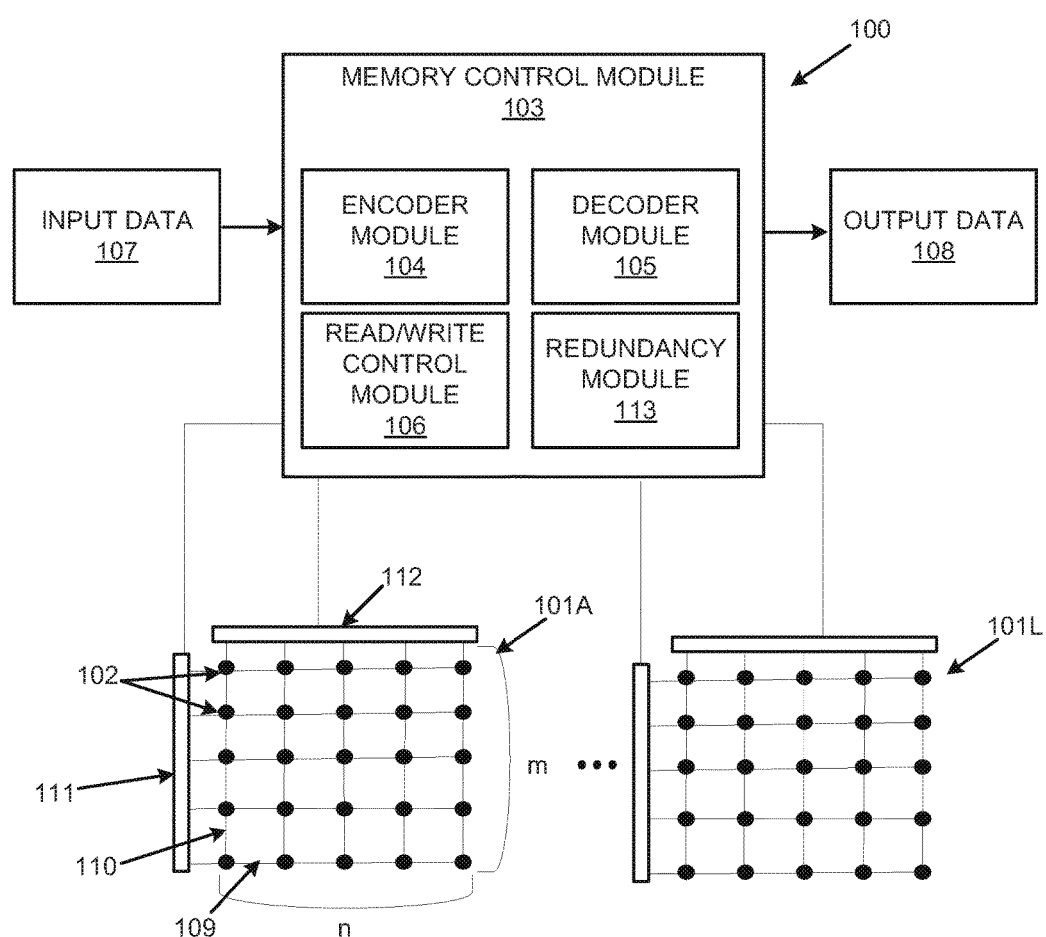
FIG. 1 shows a schematic view of a data storage apparatus including a crossbar array of memory elements, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Disclosed herein are examples of methods for assigning redundancy in encoding data onto crossbar memory arrays. Typically, error detection and correction for data, which may be encoded onto the crossbar memory arrays as a data word, may be achieved by adding redundancy (i.e., extra bits) to the data word. The combination of the data word and the redundancy may be referred to as an error correction memory codeword. In this regard, the redundancy may be used to check the consistency of the data word and to recover bits from the data word that are determined to be corrupted. However, the amount of redundancy that is necessary for a particular data word may vary due to the position (or coordinates) of the cells that store the bits of the data word in multiple crossbar memory arrays.

The disclosed methods may be implemented to reduce redundancy overhead for correcting bit errors with position dependent error rates in the multiple crossbar memory arrays. Bit errors may include bits that have been altered due to noise, interference, or distortion. According to the disclosed methods, the data, or equivalently data word or error correction memory codeword, may be allocated to a subset of cells in multiple crossbar memory arrays. The redundancy for the data may then be assigned based on coordinates of the subset of cells in the multiple crossbar memory arrays onto which the data is allocated. Also disclosed herein are a computing device and a hardware memory control circuit for implementing the methods and a non-transitory computer readable medium on which is stored machine readable instructions that implement the methods.

According to an example, the data may be allocated to cells that have similar coordinates in multiple crossbar memory arrays. In this example, the data may be encoded with a first redundancy level in response to the data being allocated in cells of the multiple crossbar memory arrays that are located beyond a predetermined distance from the voltage sources. Alternatively, in response to the data being allocated in cells of the multiple crossbar memory arrays that are located less than the predetermined distance from the voltage sources, the data may be encoded with a second redundancy level. According to an example, the first redundancy level is higher than the second redundancy level.

According to another example, a plurality of cells that have similar coordinates in multiple crossbar memory arrays may be designated to be unused. For instance, designating the plurality of cells to be unused may include determining whether a cell from the plurality of cells exceeds a predetermined bit-error rate threshold. In response to the cell exceeding the predetermined bit-error rate threshold, the plurality of cells may be designated to be unused. That is, the plurality of cells may be unavailable for an allocation of data. Alternatively, in response to the cell being at or below the predetermined bit-error rate threshold, the plurality of cells may be available for an allocation of data.

As discussed herein, the cells in the crossbar memory arrays may have varying bit error rates dependent upon the locations of the cells in the respective crossbar memory arrays. According to an example, a first portion of the data may be allocated to a first subset of cells in a first crossbar memory array and a second portion of the data may be allocated to a second subset of cells in a second crossbar memory array. The coordinates of the first subset of cells in the first crossbar memory array, for instance, may differ from the respective coordinates of the second subset of cells in the second crossbar memory array. According to an example, each bit of the data may be stored in separate crossbar memory arrays. The first portion of the data and the second portion of the data may be allocated to the cells such that an average of the bit-error rates of the allocated cells falls below a predetermined bit-error rate.

In a typical byte addressable memory, a data word (e.g., a cache-line that is 512 bits or a page that is 8 kilobytes) may be distributed across multiple crossbar memory arrays or subarrays to reduce access latency (by reading/writing bits in parallel) and to reduce cost (each subarray output will be less than the actual cache-line size). A subarray is a building block including many arrays of cells and a set of subarrays constitutes a memory bank. In non-volatile memory technologies where access energy may be relatively high, interleaving across many die may reduce the peak energy requirement per die. Further, each die may contain multiple crossbar memory arrays. However, adopting a general interleaving scheme used in other memory technologies in a crossbar memory array may lead to either high error-correction code (ECC) overhead or more read or write failures.

Particularly, as discussed further below, the locations of cells in the crossbar memory array may greatly influence the likelihood of a read or write failure (e.g., bit-error). For example, in an m×n memory array where the voltage sources are near the first row and first column, the cell at the mth row and the nth column may experience the most impact (i.e., most voltage drop across the row and least voltage drop across the cell) due to sneak or leakage current. However, the cell at the first row and the first column may experience the least impact (i.e., least voltage drop across the row and most voltage drop across the cell) due to sneak or leakage current. Accordingly, an interleaving scheme may end up grouping "good" cells in multiple crossbar memory arrays to form cache-lines and less favorably located cells in multiple crossbar memory arrays to form different cache-lines. As a result, some cache-lines may experience more errors than others, which may result in either increased ECC overhead (assuming the worst case ECC provisioning) for all the cache-lines or more read/write failures.

In one regard, the disclosed methods may be implemented to reduce redundancy overhead for correcting bit errors with position dependent error rates in multiple crossbar memory arrays. For instance, a disclosed method may provide an optimized amount of redundancy that is necessary for a particular data word based on the position of the subset of cells that store the bits of the data word in multiple crossbar memory arrays. Moreover, a disclosed method may not use a certain subset cells within the multiple crossbar memory arrays that exceed a bit-error rate threshold. Further, another disclosed example may balance a failure probability in all the cache-lines in the multiple crossbar memory arrays.

FIG. 1 illustrates a schematic view of a data storage apparatus 100 that includes a memory control module 103, according to an example. The memory control module 103 may control operations of storing data to and retrieving data from m×n memory arrays 101A-101L of cells 102, which may be memristor devices, memristors, etc. The apparatus 100 is depicted as including an encoder module 104 that is to encode data and a decoder module 105 that is to decode data. The apparatus 100 is also depicted as including a read/write control module 106 that is to control operations of reading data from the memory arrays 101A-101L and writing data to the memory arrays 101A-101L, wherein the number of crossbar arrays 101A-101L is greater than 1. Further, the apparatus 100 is depicted to include a redundancy module 113 that is to assign a redundancy for data stored in the cells 102 of the memory arrays 101A-101L. The memory control module 103 may encode input data 107 and store the encoded data into the memory arrays 101A-101L. The memory control module 103 may also read out the encoded data stored in the memory arrays 101A-101L, decode the data to recover the original bits in the input data 107, and transmit the decoded data as output data 108.

According to an example, the memory arrays 101A-101L are part of the apparatus 100. In another example, the memory arrays 101A-101L are separate from the apparatus 100. In any regard, the memory arrays 101A-101L may respectively include first and second sets of m and n conductors, e.g., wires. Each of the m conductors in the first set may cross each of the n conductors in the second set to address one of the cells 102 located at the crossing point. In order to facilitate a description of the memory arrays 101A-101L, the conductors in the first and second sets may be respectively referred to as rows (i.e., wordlines) and columns (i.e., bitlines) of the memory arrays 101A-101L. The memory arrays 101A-101L may each include m row conductors 109 and n column conductors 110 in a circuit plane. The crosspoints of the row conductors 109 and the column conductors 110 may form a total of m×n cells. The reading and writing of individual bits of data to the cells 102 involves the application of voltages by row drivers 111 and column drivers 112. The conductors 109, 110 and cells 102 may be formed in different circuit planes. Moreover, the conductors 109, 110 may be formed of a variety of shapes as needed or desired, and may likewise form a grid of a variety of shapes. Still further, the memory arrays 101A-101L may have the same or different numbers of cells 102 with respect to each other.

Figure 2:
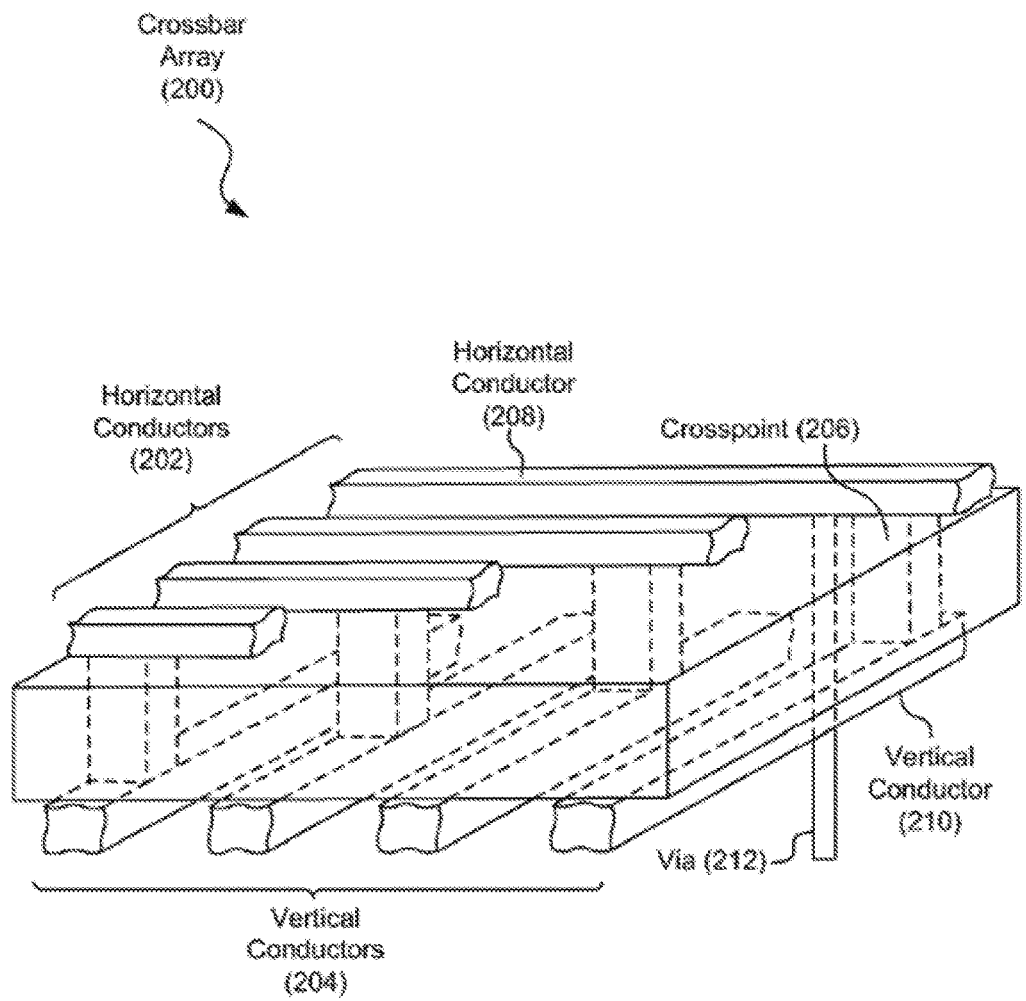
FIG. 2 shows a diagram of a crossbar memory array, according to an example of the present disclosure.

FIG. 2 is a diagram showing a perspective view of a crossbar memory array 200 according to an example of the present disclosure. According to an example, the crossbar memory array 200 includes a set of horizontal conductors 202, which are depicted as being generally in parallel with respect to each other. Additionally, a set of vertical conductors 204 is depicted as being generally perpendicular to, and crossing, the horizontal conductors 202. Programmable cells 102 are further depicted as being placed at the crosspoints 206 between a horizontal conductor 208 and a vertical conductor 210.

As discussed above, the cells 102 may be memristors or equivalently, memristor devices. Memristors exhibit a "memory" of past electrical conditions. For example, a memristor may include a matrix material that contains mobile dopants that may be moved within the matrix material to dynamically alter the electrical operation of the memristor.

The motion of dopants may be induced by the application of a programming condition such as an applied electrical voltage across the memristive matrix material. Particularly, the programming voltage generates a relatively high electrical field through the memristive matrix material and alters the distribution of dopants. After removal of the electrical field, the location and characteristics of the dopants remain stable until the application of another programming electrical field. For example, by changing the dopant configurations within the memristive matrix material, the electrical resistance of the memristor may be altered. The state of the memristor may be read by applying a lower reading voltage across the memristive matrix material which allows the internal electrical resistance of the memristor to be sensed but does not generate a sufficiently high electrical field to cause significant dopant motion. Consequently, the state of the memristor may remain stable over long time periods and through multiple read cycles.

According to an example, the crossbar memory array 200 may be used to form a non-volatile memory array. In this example, each of the cells at the crosspoints 206 may be used to represent a bit of data. Although individual conductors 208, 210 in FIG. 2 are shown with rectangular cross sections, the crossbar memory array 200 may also have square, circular, elliptical, or more complex cross sections. The conductors may also have many different widths, diameters, aspect ratios and/or eccentricities with respect to each other. The conductors 208, 210 may be nanowires, sub-microscale wires, microscale wires, or wires with larger dimensions.

According to various examples, the crossbar memory array 200 may be integrated into a Complimentary Metal-Oxide-Semiconductor (CMOS) circuit or other conventional computer circuitry. Each individual conductor may be connected to the CMOS circuitry by a via 212. The via 212 may be an electrically conductive path through the various substrate materials used in manufacturing the crossbar architecture. This CMOS circuitry may provide additional functionality to the memristor such as input/output functions, buffering, logic, configuration, or other functionality. Multiple crossbar memory arrays may be formed over the CMOS circuitry to create a multilayer circuit.

The data storage apparatus 100, for example, may involve multiple dual in-line memory modules (DIMM) including multiple memristor multichip packages, each in turn including multiple memristor dies. The memristors may be arranged in multiple crossbar memory arrays. Thus, the data storage apparatus 100 may include multiple crossbar memory arrays within the same die and across multiple dies, multiple packages, and multiple modules. In dynamic random-access memory (DRAM) replacement applications, data in the data storage apparatus 100 may be accessed (written and/or read) in cache-line sized chunks of 512 bits along with some redundant bits for error correction (i.e., memory codeword). For lowest latency performance, each bit in the memory codeword may be stored in a different crossbar memory array, each of which may be read and written to in parallel in the time span of a single memory read/write operation.

The reading and writing of an individual bit involves the application by the row and column drivers 111, 112 of suitable voltages to the row and column conductors 109, 110 that cross at a selected cell, which corresponds to the bit to be written or read. In the case of a read, the current flowing through the column conductor 110 of the selected cell is sensed to determine whether the cell is in a low resistance state (i.e., ON or logical "1") or a high resistance state (i.e., OFF or logical "0"). The cells in the same row and column as the selected cell may be referred to as half-selected cells and all other cells in the crossbar memory array 101 may be referred to as unselected cells.

The crossbar memory array 101 may experience parasitic voltage drops along the row and column conductors during the reading or writing process. The magnitude of this voltage drop at any given selected cell in the crossbar array may depend on the position of the selected cell and the amount of current leaking through the remaining unselected cells, and in particular, the half-selected cells. For instance, the farther a cell is from the row and column drivers 111, 112 (i.e., voltage sources), the larger the voltage drop across the conductors when the cell is selected. The parasitic voltage drop at a given selected cell reduces the actual voltage drop across the cell relative to the supply voltages, resulting in a reduced difference between currents for the ON and OFF resistance states and an increased likelihood of write or switching failure. While supply voltage may be increased to partially compensate for the voltage drops, this may lead to read or write disturbance on the selected cells that are closer to the supply voltages. This may also lead to increased sneak or leakage current through the half-selected and the unselected cells, and thus may not increase the voltage drop across cells that are farther from the voltage sources to the degree expected. In this regard, a consequence of the position dependent voltage drop and likelihood of write/read disturbance is a position dependent bit error rate across the multiple crossbar memory arrays due to the read/write failures.

Figure 9:
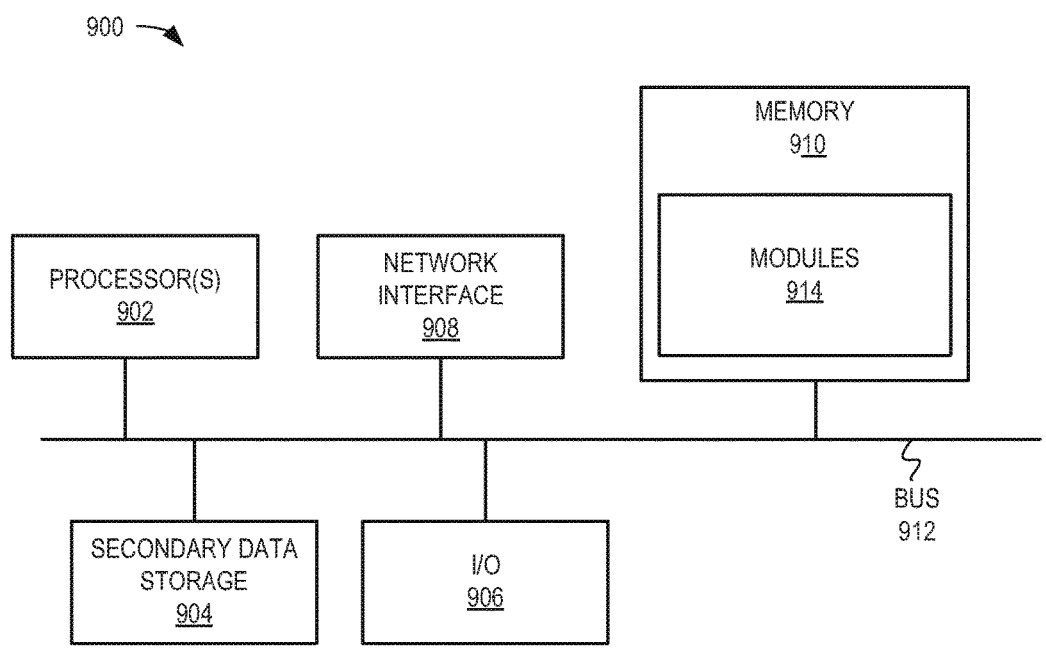
FIG. 9 shows a computer system, according to an example of the present disclosure.

FIGS. 3, 4, 6, and 7 respectively depict flow diagrams of methods 300, 400, 600 and 700 for assigning redundancy in encoding data onto crossbar memory arrays, according to examples of the present disclosure. It should be apparent to those of ordinary skill in the art that the methods 300, 400, 600 and 700 represent generalized illustrations and that other operations may be added or existing operations may be removed, modified or rearranged without departing from the scopes of the methods 300, 400, 600 and 700. The methods 400, 600, and 700 are related to the method 300 in that methods 400, 600, and 700 include operations in addition to those included in the method 300. Thus, the methods 400, 600, and 700 may be construed as including all of the features discussed with respect to the method 300. The methods 300, 400, 600, and 700 may each be implemented, for example, by a processor 902 of computing device 900 as depicted in FIG. 9 below. Additionally, the methods may be implemented in hardware, such as the memory control circuit discussed below.

Figure 3:
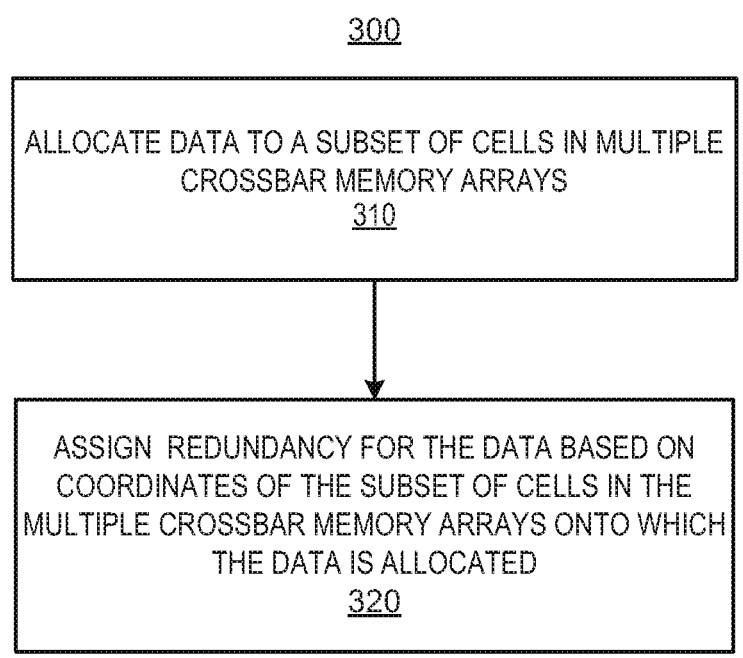
FIG. 3 shows a flow chart of a method for assigning redundancy in encoding data onto crossbar memory arrays, according to an example of the present disclosure.

With reference first to the method 300 in FIG. 3, the redundancy module 113, for instance, may allocate sufficient redundancy to correct bit errors for a worst case subset of cells (i.e., the subset of cells with the highest error rate) and use the resulting code for the subset of cells in multiple crossbar memory arrays. In other words, a subset of cells that are grouped together to store a single memory codeword may all have the same corresponding positions within their respective crossbar memory arrays. The worst case redundancy, however, may not be necessary for the better behaving subset of cells and would be wasteful from an overhead and cost perspective.

Thus, to reduce the redundancy overhead for correcting bit errors, the redundancy module 113, for instance, may allocate the data to a subset of the cells 102 in multiple crossbar memory arrays 101A-101L as shown in block 310. According to an example, the data may be allocated to cells 102 that have similar coordinates in the multiple crossbar memory arrays 101A-101L as further discussed below with respect to FIG. 4. Alternatively, the data may be assigned to cells 102 in the crossbar memory arrays 101A-101L that have varying bit error rates dependent upon the locations of the cells in the respective crossbar memory arrays as further discussed below with respect to FIG. 7. According to another example, the data may not be assigned to a plurality of cells 102 that have similar coordinates in the multiple crossbar memory arrays as further discussed below with respect to FIG. 6.

In block 320, the redundancy module 113, for instance, may assign redundancy for the data based on coordinates of the subset of cells 102 within each of the crossbar memory arrays 101A-101L onto which the data is allocated. As noted above, the farther a cell 102 is from the row and column drivers 111, 112 (i.e., voltage sources), the larger the voltage drop across the conductors 109, 110 when the cell 102 is selected. The parasitic voltage drop at a given selected cell 102 may reduce the actual voltage drop across the cell 102 relative to the supply voltages, resulting in a reduced difference between currents for the ON and OFF resistance states and an increased likelihood of write or switching failure.

According to an example, if the data is assigned to cells 102 having similar coordinates in the multiple crossbar memory arrays 101A-101L, the redundancy module 113 may determine an optimal amount of redundancy to allocate based on the location of the similar coordinates as further discussed below with respect to FIG. 4. According to another example, if the data is assigned to cells 102 having varying coordinates in multiple crossbar memory arrays 101A-101L, the redundancy module 113 may allocate a same amount of redundancy to the data. The same amount of redundancy may be based on an acceptable average bit error rate that is calculated from the evenly distributed subset of cells with different coordinates in each of the plurality of crossbar memory arrays as further discussed below with respect to FIG. 7. According to a further example, the locations of the subset of cells in multiple crossbar memory arrays 101A-101L may also determine whether the subset of cells 102 may be used to store data, as further discussed below with respect to FIG. 6.

Figure 4:
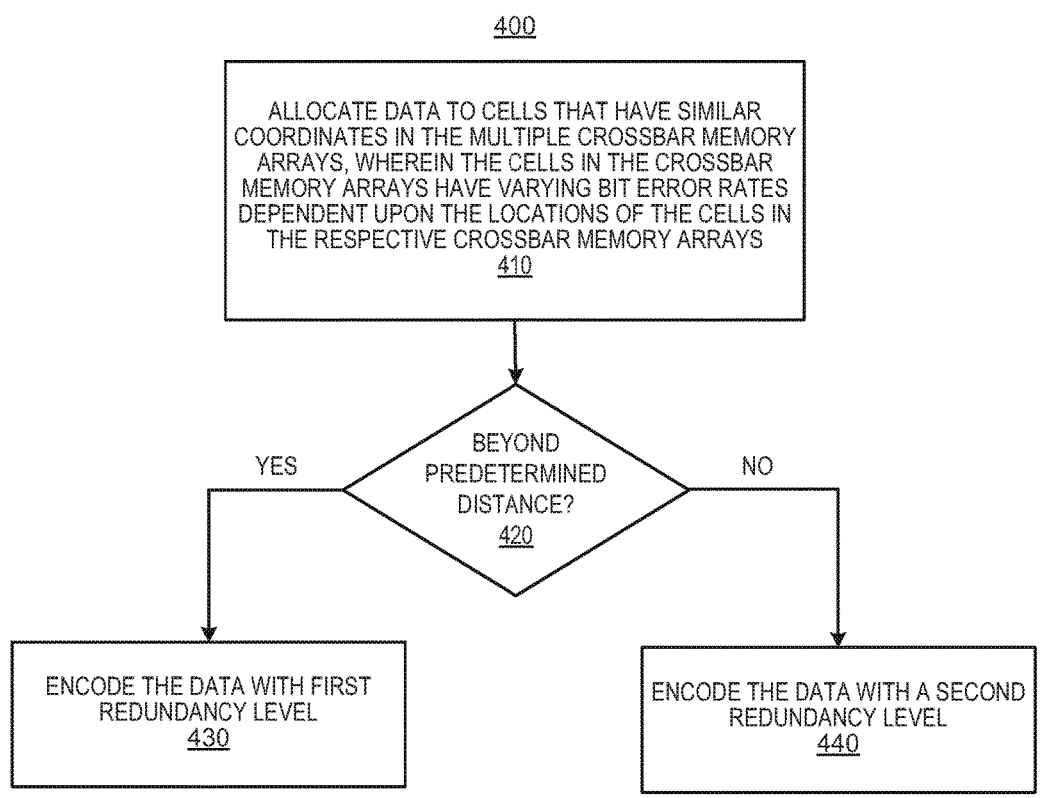
FIG. 4 shows a flow chart of a method for determining redundancy for data that is assigned to cells having similar coordinates in multiple crossbar memory arrays, according to an example of the present disclosure.
Figure 5:
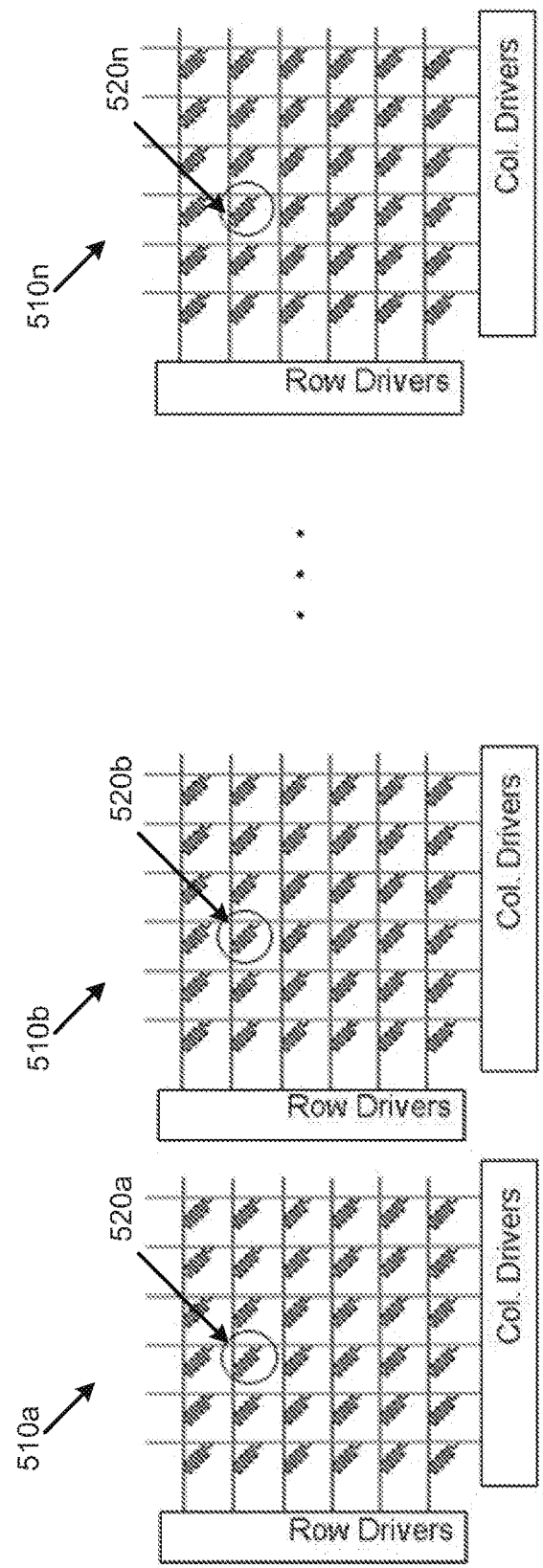
FIG. 5 shows a subset of cells with similar coordinates within multiple crossbar memory arrays, according to an example of the present disclosure.

Turning now to the method 400 in FIG. 4, in block 410, the redundancy module 113, for instance, may allocate the data to the cells 102 that have similar coordinates in the multiple crossbar memory arrays 101A-101L. As discussed above, the cells 102 in the crossbar memory arrays 101A-101L have varying bit error rates dependent upon the locations of the cells in the respective crossbar memory arrays 101A-101L. In this regard, the data may be allocated to a subset of cells 102 that have the same position in multiple crossbar memory arrays 101A-101L, but the redundancy module 113 may assign position dependent amounts of redundancy to the data according to method 400. FIG. 5 illustrates an example of multiple crossbar memory arrays 510a, 510b, and 510n. As illustrated in FIG. 5, cells 520a, 520b, and 520n have similar coordinates within the multiple crossbar memory arrays 510a, 510b, and 510n. The memory control module 103, for instance, may determine how to encode and decode the data and how much additional redundancy to read or write based on the similar coordinates of the cells storing the data.

According to an example, a determination may be made, for instance, by the redundancy module 113, as to whether the cells 102 upon which the data is being allocated are located beyond a predetermined distance from the voltage sources, as shown in block 420 in FIG. 4. The predetermined distance, for instance, may be a sum of the coordinates of the cell, a sum of squares of the coordinates, etc.

In response to the data being allocated in cells 102 of the multiple crossbar memory arrays 510a-510n that are located beyond a predetermined distance from the voltage sources, the data may be encoded with a first redundancy level, as shown in block 430. Alternatively, in response to the data being allocated in cells 102 of the multiple crossbar memory arrays 510a-510n that are located less than the predetermined distance from the voltage sources, the data may be encoded with a second redundancy level, as shown in block 440. According to an example, the first redundancy level is higher than the second redundancy level. In addition or alternatively, the suitable redundancies and encodings may be determined off-line after a crossbar characterization procedure.

The method 400 may group together all cells 102 within the data storage apparatus 100 that are located at similar positions in multiple crossbar memory arrays 101A-101L and may divide each of the groups into a plurality of independently accessible memory codewords with an amount of redundancy that is dependent on the position of the cells 102 within the group. According to an example, an interface to the memory control module 103 may support low latency access to memory codewords of all possible lengths.

Figure 6:
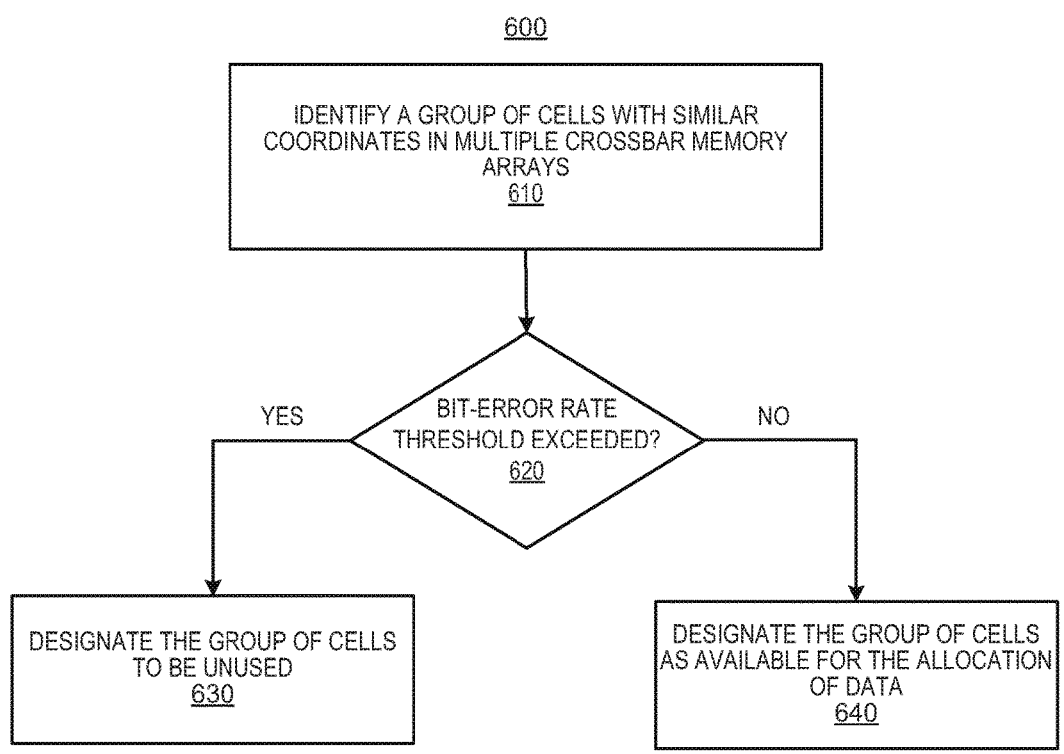
FIG. 6 shows a flow chart of a method for assigning a plurality of cells that have similar coordinates in multiple crossbar memory arrays to be unused, according to an example of the present disclosure.

Turning now to the method 600 in FIG. 6, in block 610, the redundancy module 113, for instance, may identify a group of cells 102 with similar coordinates in multiple crossbar memory arrays 101A-101L. In block 620, a determination may be made as to whether a cell 102 from the group of cells exceeds a predetermined bit-error rate threshold. The predetermined bit-error rate threshold may be based on an off-line, experimental or simulation based characterization of position dependent bit-error rates. According to one non-limiting example, the predetermined bit-error rate threshold may be determined to optimally tradeoff the number of unused cells with extra cells that include the redundancy used to encode the data.

In response to the cell 102 exceeding the predetermined bit-error rate threshold, the group of cells may be designated to be unused, as shown in block 630. In other words, a group of cells 102 that have bit-error rates above the bit-error threshold may be identified as being unavailable for the allocation of data. Thus, the unused group of cells may not be populated with data in the multiple crossbar memory arrays 101A-101L to further reduce sneak or leakage current. Alternatively, if the group of cells require a forming process and are in a very high resistance state when unformed, the unused group of cells may not be formed according to an example of the present disclosure.

In response to the cell 102 being at or below the predetermined bit-error rate threshold, the group of cells may be made available for the allocation of data, as shown in block 640. According to an example, the group of cells 102 that are made available for the allocation of data may be grouped into corresponding memory codewords that have sufficient redundancy to handle a worst case of bit error rates. Further, the data allocated to the group of cells 102 that are made available for the allocation of data may be encoded with a same redundancy as other data in the multiple crossbar memory arrays 101A-101L.

According to method 600, data may be assigned to a group of cells 102 that have similar positions within their respective crossbar memory arrays 101A-101L. Additionally, all of the data may have the same redundancy and may be based on the same code, but a group of cells 102 in similar positions or coordinates in multiple crossbar memory arrays 101A-101L may simply not be used. In this regard, the combined overhead of the smaller allocated redundancy of the used cells and the unused cells may be minimized.

Figure 7:
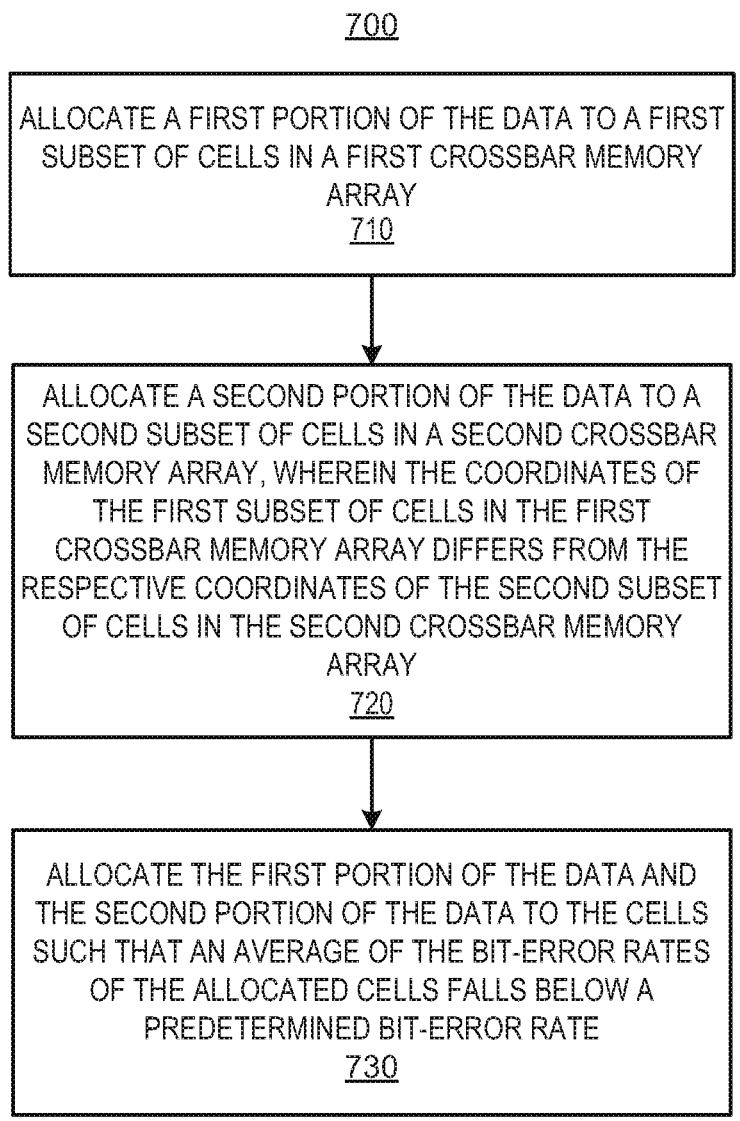
FIG. 7 shows a flow chart of a method for allocating data to cells that have varying bit error rates in crossbar memory arrays, according to an example of the present disclosure.

Turning now to the method 700 in FIG. 7, a same redundancy and length may be used for all memory codewords. In block 710, the redundancy module 113, for instance, may allocate a first portion of the data to a first subset of cells 102 in a first crossbar memory array 101A. In block 720, the redundancy module 113, for instance, may allocate a second portion of the data to a second subset of cells 102 in a second crossbar memory array 101B, in which the coordinates of the first subset of cells 102 in the first crossbar memory array 101A differs from the respective coordinates of the second subset of cells 102 in the second crossbar memory array 101B. According to an example, the different coordinates for each subset of cells 102 may be selected and grouped such that the coordinates of each cell 102 assigned to the data is evenly or nearly evenly distributed across the multiple crossbar memory arrays 101A-101L.

Figure 8:
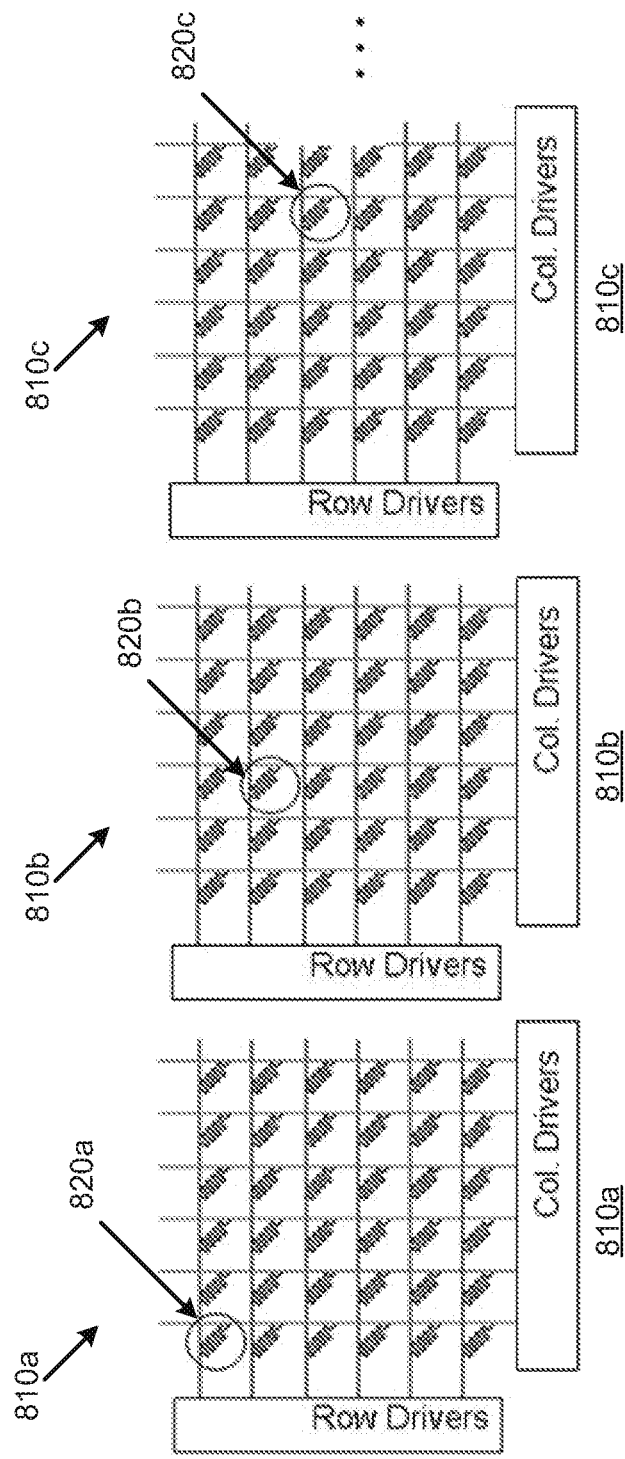
FIG. 8 shows cells with different coordinates in multiple crossbar memory arrays, according to an example of the present disclosure.

For instance, the redundancy module 113 may select a subset of cells 102 with positions (i, j), (i+a, j+b), (i+2a, j+2b), (i+3a, j+3b), etc., for some pair of offsets a and b, where addition is modulo N for N×N arrays. As shown in FIG. 8, the cells 820a-820c of the multiple crossbar memory arrays 810a-810c correspond to an example with i=6, j=1 (assuming the lower left cell has coordinates (1, 1)) and a=−1, b=2. Accordingly, if the crossbar memory array is N×N, this selection process repeats after N steps, but may actually take N steps if a and b are selected properly.

After the data has been evenly distributed to the subset of cells 102 having varying coordinates in the multiple crossbar memory arrays 101A-101L, the redundancy module 113, for instance, may allocate the first portion of the data and the second portion of the data to the cells 102 such that an average of the bit-error rates of the allocated cells falls below a predetermined bit-error rate, as shown in block 730. In this regard, the redundancy for all of the data may be allocated based on the average bit-error rate of the evenly distributed subset of cells 102.

Accordingly, all of the memory codewords allocated according to the method 700 may have the same length and redundancy, but each memory codeword may include a subset of cells 102 from different coordinates within their respective crossbar memory arrays 101A-101L. Therefore, the method 700 may combine "good" cells 102 and "bad" cells 102 together to arrive at an acceptable average bit error rate across the cells 102 in each memory codeword.

FIG. 9 shows a computer system 900 that may be used with the examples described herein. The computer system 900 represents a generic platform that includes components that may be in a server or another computer system. The computer system 900 may be used as a platform for the data storage apparatus 100. The computer system 900 may execute, by a processor 902 or other hardware processing circuit, the methods, functions and other processes described herein. These methods, functions and other processes may be embodied as machine readable instructions stored on computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 900 includes a processor 902 that may implement or execute machine readable instructions performing some or all of the methods, functions and other processes described herein. Commands and data from the processor 902 are communicated over a communication bus 912. The computer system 900 also includes a main memory 910, such as a random access memory (RAM), where the machine readable instructions and data for the processor 902 may reside during runtime, and a secondary data storage 904, which may be non-volatile and stores machine readable instructions and data. The memory 910 and the secondary data storage 904 are examples of computer readable mediums. The memory 910 may include modules 914 including machine readable instructions residing in the memory 910 during runtime and executed by the processor 902. The modules 914 may include the modules 103, 104, 105, 106, and 113 of the apparatus 100 shown in FIG. 1.

The computer system 900 may include an I/O device 906, such as a keyboard, a mouse, a display, etc. The computer system 900 may include a network interface 908 for connecting to a network. Other known electronic components may be added or substituted in the computer system 900.

The modules 103, 104, 105, 106, and 113 may also be implemented in hardware, such as a memory control circuit that includes the functionalities of the encoder module 104, the decoder module 105, the read/write control module 106, and the redundancy module 113.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. A method for assigning redundancy in encoding data onto crossbar memory arrays, each of said crossbar memory arrays including cells, the method comprising:
    allocating, by a processor, the data to a subset of the cells in multiple crossbar memory arrays; and
    assigning redundancy for the data based on coordinates of the subset of cells in the multiple crossbar memory arrays onto which the data is allocated, including encoding the data with the assigned redundancy within the multiple crossbar memory arrays,
    wherein assigning the redundancy based on the coordinates of the subset of cells decreases overhead in providing redundancy for the data within the multiple crossbar memory arrays.

2. The method of claim 1, wherein allocating the data further includes:
    allocating the data to the cells that have similar coordinates in the multiple crossbar memory arrays, wherein the cells in the crossbar memory arrays have varying bit error rates dependent upon the locations of the cells in the respective crossbar memory arrays.

3. The method of claim 2, wherein assigning the redundancy for the data further includes:
    in response to the data being allocated in cells of the multiple crossbar memory arrays that are located beyond a predetermined distance from voltage sources, encoding the data with a first redundancy level; and
    in response to the data being allocated in cells of the multiple crossbar memory arrays that are located less than the predetermined distance from the voltage sources, encoding the data with a second redundancy level, wherein the first redundancy level is higher than the second redundancy level.

4. The method of claim 1, wherein allocating the data further includes:
    designating a plurality of cells that have similar coordinates in multiple crossbar memory arrays to be unused.

5. The method of claim 4, allocating the data further includes:
    determining whether a cell from the plurality of cells exceeds a predetermined bit-error rate threshold;
    in response to the cell exceeding the bit-error rate threshold, designating the plurality of cells to be unused, wherein the plurality of cells are unavailable for the allocation of data; and
    in response to the cell being at or below the bit-error rate threshold, designating the plurality of cells as being available for the allocation of data.

6. The method of claim 1, wherein the cells in the crossbar memory arrays have varying bit error rates dependent upon the locations of the cells in the respective crossbar memory arrays and wherein allocating the data further includes:
  allocating a first portion of the data to a first subset of cells in a first crossbar memory array; and
  allocating a second portion of the data to a second subset of cells in a second crossbar memory array, wherein the coordinates of the first subset of cells in the first crossbar memory array differ from the respective coordinates of the second subset of cells in the second crossbar memory array.

7. The method of claim 6, wherein allocating the first portion of the data and the second portion of the data further includes:
  allocating the first portion of the data and the second portion of the data to the cells such that an average of the bit-error rates of the allocated cells falls below a predetermined bit-error rate.

8. An apparatus for assigning redundancy in encoding data onto crossbar memory arrays, each of said crossbar memory arrays including cells, comprising memory control circuit to:
  distribute the data to a subset of cells across multiple crossbar memory arrays, wherein the data is distributed to one of cells that have similar coordinates in the multiple crossbar memory arrays and cells that have different coordinates in the multiple crossbar memory arrays; and
  assign redundancy for the data based on coordinates of the subset of cells within the multiple crossbar memory arrays onto which the data is distributed, including encoding the data with the assigned redundancy within the multiple crossbar memory arrays,
  wherein assignment of the redundancy based on the coordinates of the subset of cells decreases overhead in providing redundancy for the data within the multiple crossbar memory arrays.

9. The apparatus of claim 8, wherein to distribute the data to the cells that have similar coordinates, the memory control circuit is to:
  encode the data with a first redundancy level in response to the data being distributed in cells of the multiple crossbar memory arrays that are located beyond a predetermined distance from voltage sources; and
  encode the data with a second redundancy level in response to the data being distributed in cells of the multiple crossbar memory arrays that are located less than the predetermined distance from the voltage sources, wherein the first redundancy level is higher than the second redundancy level.

10. The apparatus of claim 8, wherein the cells that have different coordinates in the crossbar memory arrays have varying bit error rates dependent upon the locations of the cells in the respective crossbar memory arrays, and wherein to distribute the data to the cells that have different coordinates, the memory control circuit is to:
  distribute a first portion of the data to a first subset of cells in a first crossbar memory array;
  distribute a second portion of the data to a second subset of cells in a second crossbar memory array, wherein the coordinates of the first subset of cells in the first crossbar memory array differs from the respective coordinates of the second subset of cells in the second crossbar memory array; and
  distribute the first portion of the data and the second portion of the data to the cells such that an average of the bit-error rates of the distributed cells falls below a predetermined bit-error rate.

11. The apparatus of claim 8, wherein to distribute the data to the subset of cells, the memory control circuit is to designate a plurality of cells that have similar coordinates in multiple crossbar memory arrays to be unused.

12. The apparatus of claim 11, wherein to distribute the data to the subset of cells, the memory control circuit is to:
  determine whether a cell from the plurality of cells exceeds a predetermined bit-error rate threshold;
  in response to the cell exceeding the bit-error rate threshold, designate the plurality of cells to be unused, wherein the plurality of cells are unavailable for the allocation of data; and
  in response to the plurality of cells being at or below the bit-error rate threshold, designate the plurality of cells to be available for the allocation of data.

13. A non-transitory computer readable medium to assign redundancy in encoding data onto crossbar memory arrays, each of said crossbar memory arrays including cells, including machine readable instructions executable by a processor to:
  identify a group of cells that have been assigned a usable state across multiple crossbar memory arrays;
  allocate the data to the group of cells, wherein the data may be allocated to one of cells that have similar coordinates in the multiple crossbar memory arrays and cells that have different coordinates in the multiple crossbar memory arrays; and
  assign redundancy for the data based on coordinates of the group of cells within the multiple crossbar memory arrays onto which the data is allocated, including encoding the data with the assigned redundancy within the multiple crossbar memory arrays,
  wherein assignment of the redundancy based on the coordinates of the subset of cells decreases overhead in providing redundancy for the data within the multiple crossbar memory arrays.

14. The non-transitory computer readable medium of claim 13, wherein to allocate the data to cells that have similar coordinates, the machine readable instructions are executable by the processor to:
  encode the data with a first redundancy level in response to the data being allocated in cells of the multiple crossbar memory arrays that are located beyond a predetermined distance from voltage sources; and
  encode the data with a second redundancy level in response to the data being allocated in cells of the multiple crossbar memory arrays that are located less than the predetermined distance from the voltage sources, wherein the first redundancy level is higher than the second redundancy level.

15. The non-transitory computer readable medium of claim 13, wherein the cells that have different coordinates in the crossbar memory arrays have varying bit error rates dependent upon the locations of the cells in the respective crossbar memory arrays, and wherein to allocate the data to the cells that have different coordinates, the machine readable instructions are executable by the processor to:
  allocate a first portion of the data to a first subset of cells in a first crossbar memory array;
  allocate a second portion of the data to a second subset of cells in a second crossbar memory array, wherein the coordinates of the first subset of cells in the first crossbar memory array differs from the respective coordinates of the second subset of cells in the second crossbar memory array; and allocate the first portion of the data and the second portion of the data to the cells such that an average of the bit-error rates of the allocated cells falls below a predetermined bit-error rate.

\* \* \* \* \*